US005897883A

United States Patent [19]

Cho et al.

[11] Patent Number: 5,897,883

[45] Date of Patent: Apr. 27, 1999

[54] MOLD HAVING PROJECTIONS FOR INHIBITING THE FORMATION OF AIR POCKETS

[75] Inventors: Chang Ho Cho, Seoul; Joong Hyun Baek, Suwon, both of Rep. of Korea

[73] Assignee: Samsung Electronics Co., Ltd., Suwon, Rep. of Korea

[21] Appl. No.: 08/934,849

[22] Filed: Sep. 22, 1997

[30] Foreign Application Priority Data

Sep. 24, 1996 [KR] Rep. of Korea .................... 96-42117

[51] Int. Cl.[6] .......................... B29C 45/14; B29C 45/26

[52] U.S. Cl. ........................ 425/116; 425/544; 425/572; 264/272.17; 264/328.12

[58] Field of Search .................................. 425/116, 117, 425/546, 544, 572, 812; 264/272.17, 328.12

[56] References Cited

U.S. PATENT DOCUMENTS 5,214,846 6/1993 Asami et al. .................... 264/272.17
5,686,038 11/1997 Christensen et al. ................. 425/546

FOREIGN PATENT DOCUMENTS 59-81125 5/1984 Japan .............................. 264/272.17
59-81126 5/1984 Japan .............................. 264/272.17
2-130843 5/1990 Japan .............................. 264/272.17

*Primary Examiner*—Robert Davis
*Attorney, Agent, or Firm*—Jones & Volentine, L.L.P.

[57] ABSTRACT

A mold for encapsulating semiconductor device packages provides improved reliability by reducing air traps in the encapsulant. The mold has an upper mold die and a lower mold die which together form a cavity where the package is encapsulated by the molding compound. Air traps are reduced by equipping the lower mold die with projections formed along edges of the cavity extending in the direction of the molding compound flow. The mold allows a reduction of the formation air traps around or at the positions where the lead frame and chip are located so that the reliability of the resulting package is improved.

7 Claims, 18 Drawing Sheets

MOLD HAVING PROJECTIONS FOR INHIBITING THE FORMATION OF AIR POCKETS

BACKGROUND OF THE INVENTION

1. Field of the Invention

The present invention relates generally to a molding apparatus. More particularly, it relates to a mold for encapsulating semiconductor device packages having improved reliability due to reduced formation of air traps in the encapsulant. The presence of air traps is reduced by equipping the mold of the present invention with projections inside the mold cavity, extending along the sides of the lower half of the cavity in the direction of flow of the molding compound.

2. Background of the Related Art

In fabricating lead-on-chip (LOC) packages, a lower surface of the inner leads of the lead frame is attached to an upper surface of the chip by way of a double-sided polyimide adhesive tape. Each one of the bonding pads on the chip is electrically connected to a respective corresponding one of the inner leads on the chip by way of electrical connection means such as bonding wires. Thereafter, an encapsulation process using encapsulants such as epoxy molding compounds is performed to protect the chip, inner leads and electrical interconnections from exterior environmental stresses and to form a package body.

A mold is used to encapsulate the semiconductor package assemblies and transfer molds are employed for carrying out the encapsulation using a molding compound. The term 'mold' used throughout the present application refers to transfer molds. In particular, the present invention will be described in relation to a mold adapted for encapsulating LOC packages, but is not limited thereto.

FIG. 1 is an exploded perspective view of a conventional transfer mold for encapsulation of semiconductor device packages; FIG. 2 is an enlarged perspective view of the part 'A' in FIG. 1; and FIG. 3 is a cross-sectional view taken along the line '3—3' in FIG. 2.

With reference to FIG. 1 through FIG. 3, a mold 100 comprises a mold body 70 having an upper mold die 50 and a lower mold die 60, and a press 40.

The press 40 has a support plate 20 which is mechanically coupled to a vertically movable transfer means (not shown); a cylinder 10 integral with an upper surface of the support plate 20, the cylinder containing an oil 35 and being provided with a hydraulic inlet port 12 and a hydraulic outlet port 14; and a press cylinder rod 30, an upper part of which is within the cylinder 10 and a lower part of which extends downwardly from the cylinder 10.

The lower mold die 60 is mounted onto and fixed to a base part (not shown) located at the lowermost part of the mold 100. The lower mold die has a chase 62 for receiving molding compound tablets; a plurality of runners 64 in communication with the chase 62; a plurality of gates 66, each gate integral with a corresponding one of the runners 64; and a plurality of cavities 68 in communication with a respective corresponding one of the gates 66. The package assembly has electrical interconnections between each component and is encapsulated within the cavity 68. The runners 64 and gates 66 are passages through which the molding compounds pass so that cavities 68 are filled with the molding compounds.

The upper mold die 50 is mechanically coupled to a vertically movable transfer means (not shown), for example, at its upper surface. The upper mold die 50 has a port 52 where molding compound tablets are loaded. The upper mold die 50 has a symmetric structure to that of the lower mold die 60, including a plurality of cavities 58, but excluding the gates 66 described above.

The operation of the mold 100 will be described hereinafter with reference to FIGS. 4A and 4B.

FIG. 4A is a perspective view depicting a lead frame within a transfer mold and FIG. 4B is an enlarged view of portion 'B' of FIG. 4A; FIG. 5 is a perspective view depicting the package assemblies after the molding process is completed; FIG. 6 is an enlarged perspective view of the part 'C' in FIG. 5; and FIG. 7 is a cross-sectional view taken along the line '7—7' in FIG. 6.

Now, the molding process and the operation of the mold 100 will be explained with reference to FIG. 4 through FIG. 7.

Lead frame strips 200 are placed into the cavities 68 in the lower mold die 60. The lead frame strips comprise a plurality of lead frame units, each lead frame unit having a chip 110, inner leads 142 attached to the chip 110, and electrical connection means such as bonding wires 160. As shown in FIGS. 4B and 7, each lead frame has a plurality of parallel inner leads 142 which are placed onto two opposite sides of an upper surface of the chip, and the chip is attached to the inner leads by way of adhesives, for example double-sided polyimide tape 150. Further, the chip is electrically connected at bonding pads 112 to inner leads 142 by way of electrical connections such as bonding wires 160. Outer leads 144 formed integrally with the inner leads 142 remain exposed to the outside of the package body after the molding process is completed and are electrically connected to external devices such as printed circuit boards.

The upper mold die 50 is lowered by a transfer means, which is mechanically coupled to the upper mold die 50, until the bottom of the upper mold die 50 contacts the upper surface of the lower mold die 60. Thereafter, molding compound tablets are introduced into the port 52 in the upper mold die 50.

The pressing means 40 is lowered until the bottom of the press cylinder rod 30 contacts the tablets or reaches a specified distance from the tablets. The lowering of the pressing means is accomplished by a transfer means coupled mechanically thereto.

Oil 35 is charged into the cylinder 10 through the hydraulic inlet port 12, pressing on the press cylinder rod 30, thereby pressing down the pressing means 40. The lowered press cylinder rod 30 presses the molding compound tablets which are in a molten state so that the fluid molding compound 80 flows into the port 52, runners 64, gates 66, and cavities 58, 68. The molding compound tablets can be melted by the action of preheated mold dies 50, 60 having a temperature from about 170° C. to about 180° C., or the action of a separate heater. The encapsulated lead frame units 90 are encapsulated so that the chip 110, inner leads 142 and electrical interconnections 160 are covered with the molding compound.

After the molding process is completed, the pressing means 40 and the upper mold die 50 are elevated by the transfer means, and flow of the fluid molding compound 80 is stopped. Then, the lead frame strip 200 is removed from the mold die.

FIG. 8 depicts a schematic model of a transfer mold used to study molding compound velocity and air traps within the mold; FIG. 9 depicts the result of simulations for determining the molding compound flow within the transfer mold;

and FIG. 10 depicts the distribution of air traps in the upper and lower mold die of the cavity, which is obtained from the result in FIG. 9.

With reference to FIGS. 8 through 10, the model mold having a cavity employed for the simulations has a size of 1.0 mm×13.00 mm. All the components within the cavity are omitted for simplicity. The molding compound runs through a common runner $R_1$, and flows into the cavity $C_1$ via the gate $G_1$ and then flows into the next cavity $C_{11}$ via the gate $G_{11}$. The cavity $C_1$ is located closer to the port 52 (see FIG. 4A) than the cavity $C_{11}$.

The shear velocities $\beta_1$ and $\beta_{11}$ in the lower mold die are greater than the shear velocities $\alpha_1$ and $\alpha_{11}$ in the upper mold die, since the flow channel in the upper mold die is narrower than that in the lower mold die, and the molding compound flowing therein undergoes a greater flow resistance. Further, since the molding compound is introduced into the lower mold of the cavity after being introduced into the upper mold of the cavity and the shear velocities $\alpha_1$ and $\alpha_{11}$, and $\beta_1$ and $\beta_{11}$ are measured at the same time, the shear velocities $\beta_1$ and $\beta_{11}$ in the lower mold cavity are inevitably higher than the shear velocities $\alpha_1$ and $\alpha_{11}$ in the upper mold cavity.

As a result, air traps T are formed where the molding compound does not flow uniformly, and where the molding compound does not fully fill the cavity, thereby causing air bubbles.

The partial filling of the molding compound and the creation of air bubbles may reduce package reliability. Specifically, water vapor is introduced at the partially filled portion and/or air bubble portion during the package reliability tests which are performed at elevated temperature and pressure. The water vapor causes separation between the inner leads and the chip and electrical shorts at the bonding wires.

The air traps T produced within the encapsulated package are localized at the positions having the greatest velocity deviation along the shear velocities shown in FIG. 9. Moreover, more air traps T are observed at the positions farthest from the gates $G_1$ and $G_{11}$ of the cavities $C_1$ and $C_{11}$. Note that the small and large circles in FIG. 10 simulate the small and large openings of a lead frame during the simulation of the flow of molding compound within the transfer mold.

SUMMARY OF THE INVENTION

It is therefore an object of the present invention to avoid the problems associated with the formation of air traps at or near the chip, inner leads and bonding wire interconnections.

Another object of the present invention is to provide a mold which allows an improvement in the semiconductor device package reliability by distributing air traps formed during the encapsulation molding process away from chip, inner leads and wire bonding interconnections.

The above objects of the present invention are accomplished by a mold comprising a lower mold die, said lower mold die having continuous projections along its opposite bottom edges extending in the direction of flow of the molding compound.

BRIEF DESCRIPTION OF THE ATTACHED DRAWINGS

These and various other features and advantages of the present invention will be described with reference to the following detailed description taken in conjunction with the accompanying drawings. In the drawings, all dimensions are in millimeters (mm) unless otherwise indicated and like reference numerals designate like structural elements, in which.

DETAILED DESCRIPTION OF PREFERRED EMBODIMENT

Figure 1:
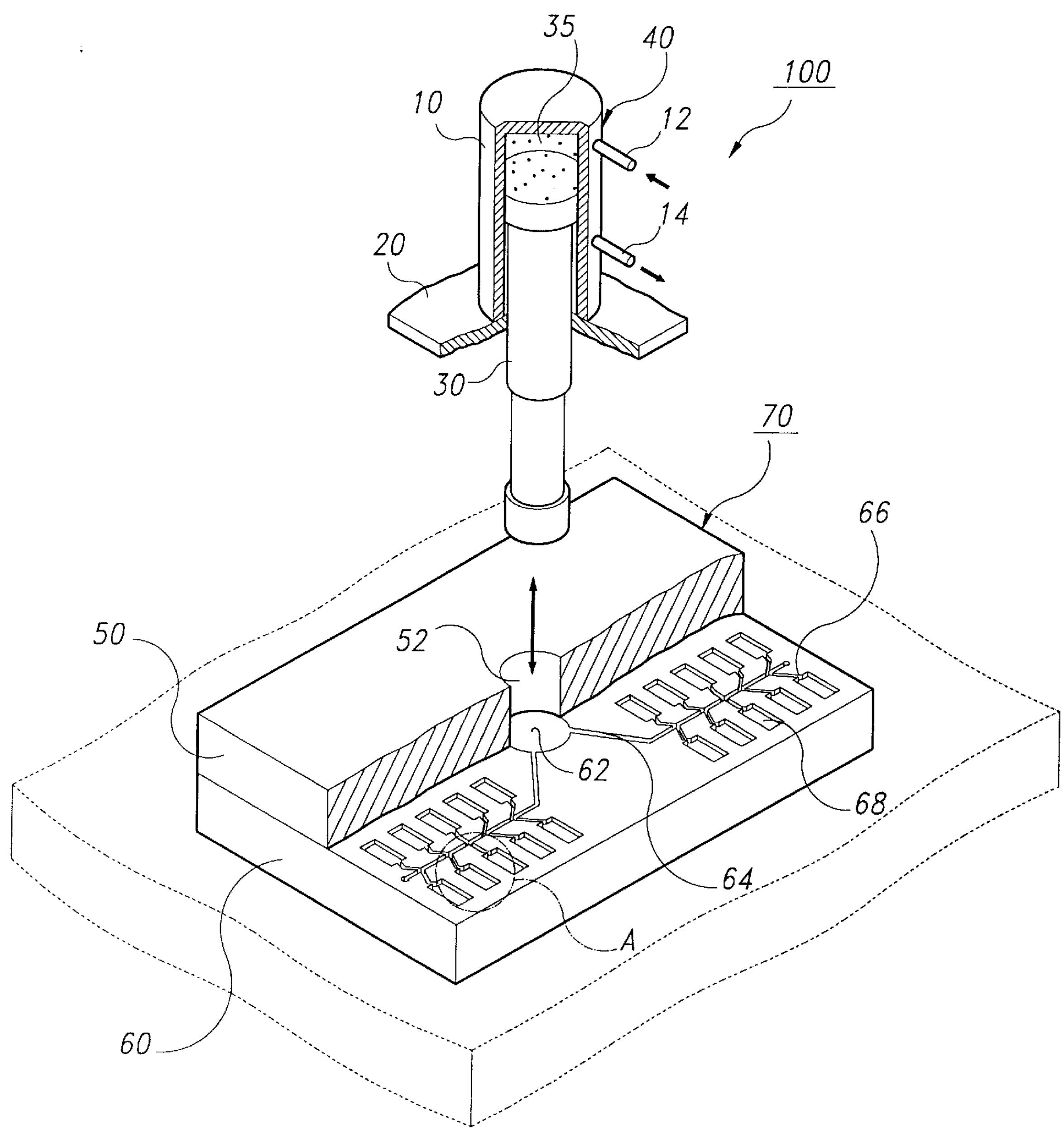
FIG. 1 is an exploded perspective view of a conventional transfer mold for encapsulation of semiconductor device packages.
Figure 2:
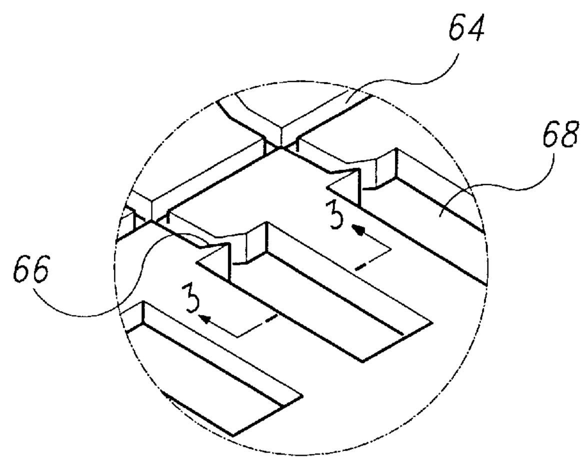
FIG. 2 is an enlarged perspective view of the part 'A' in FIG. 1.
Figure 3:
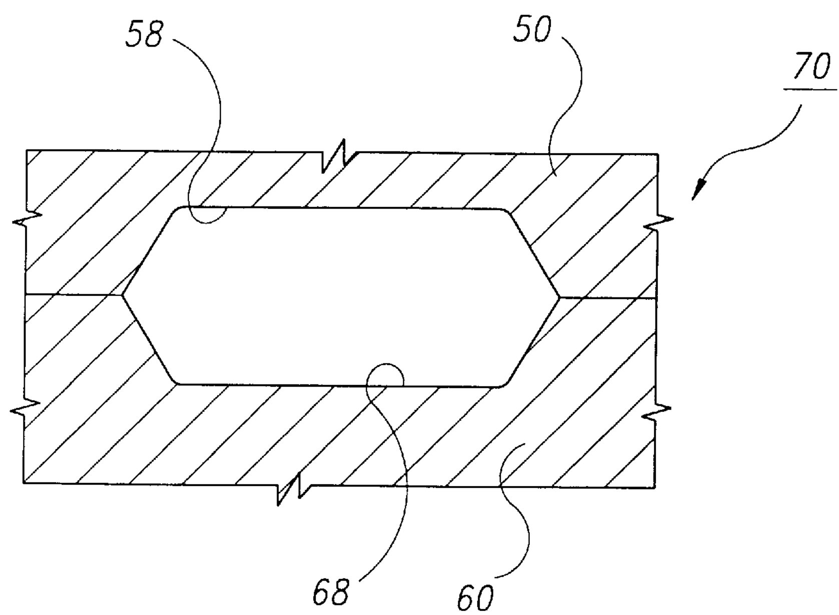
FIG. 3 is a sectional view taken along the line '3—3' in FIG. 2.
Figure 4A:
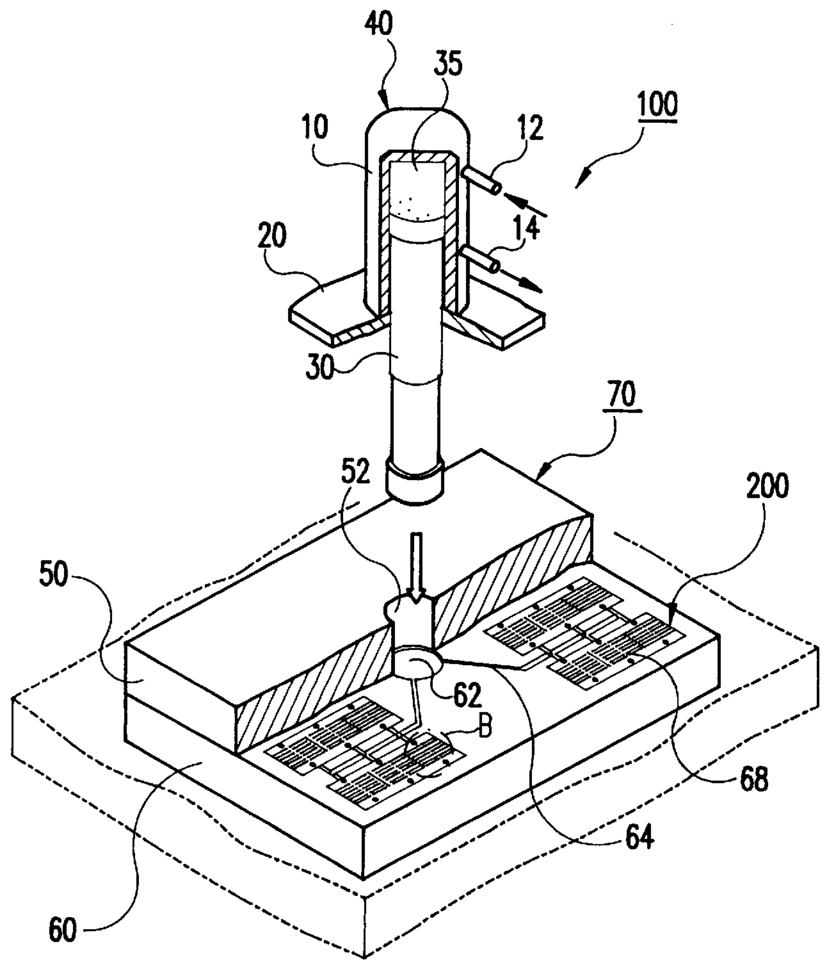
FIG. 4A is a perspective view depicting a lead frame within the transfer mold of FIG. 1.
Figure 4B:
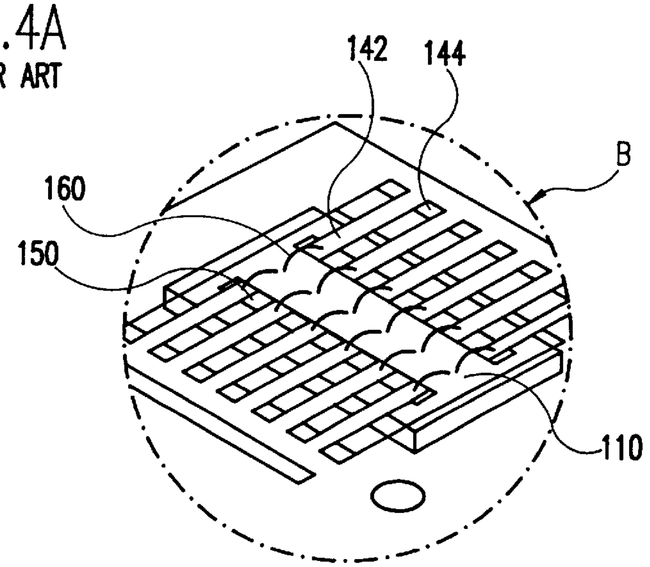
FIG. 4B is an enlarged view of portion 'B' in FIG. 4A.
Figure 5:
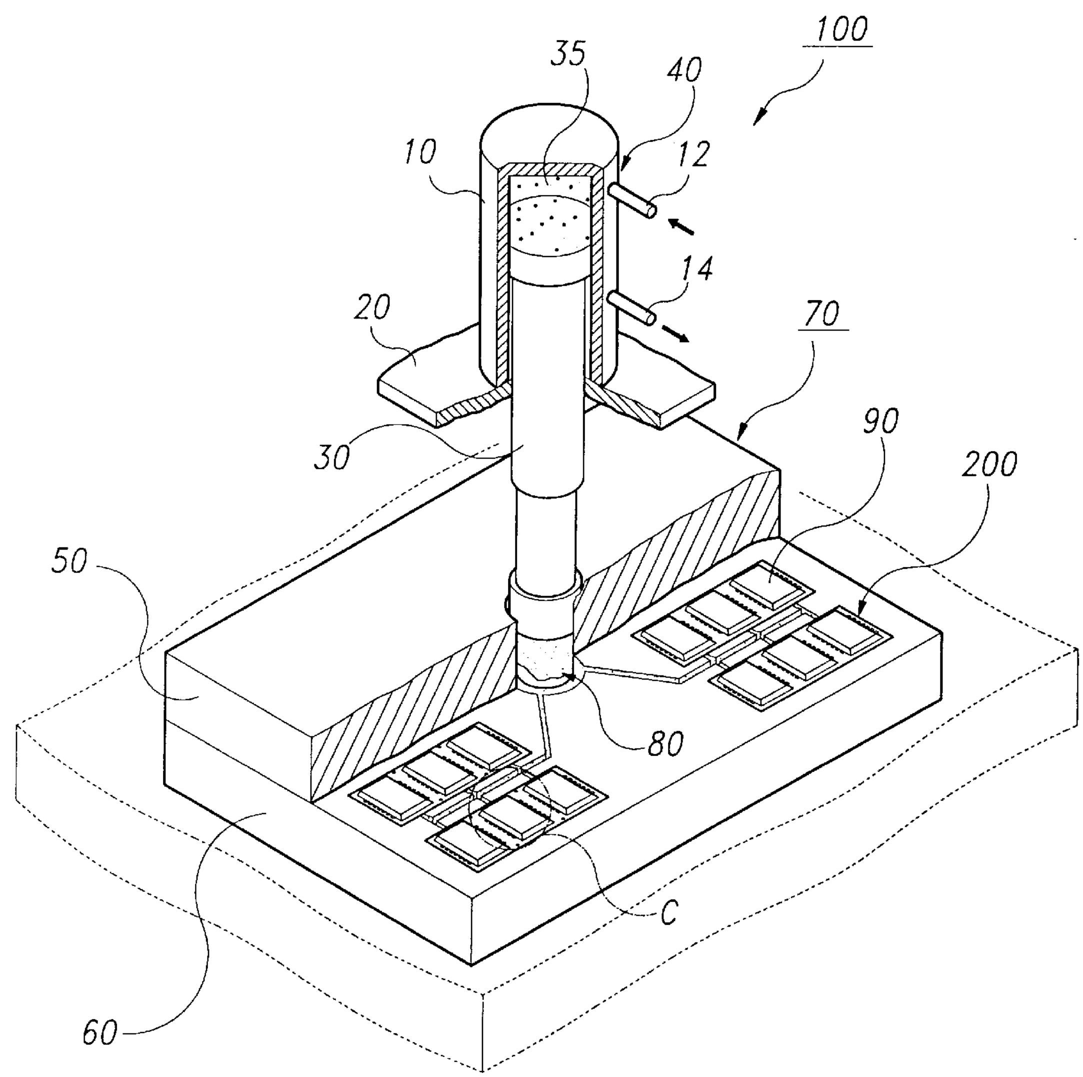
FIG. 5 is a perspective view depicting the package assemblies after the conventional molding process is completed.
Figure 6:
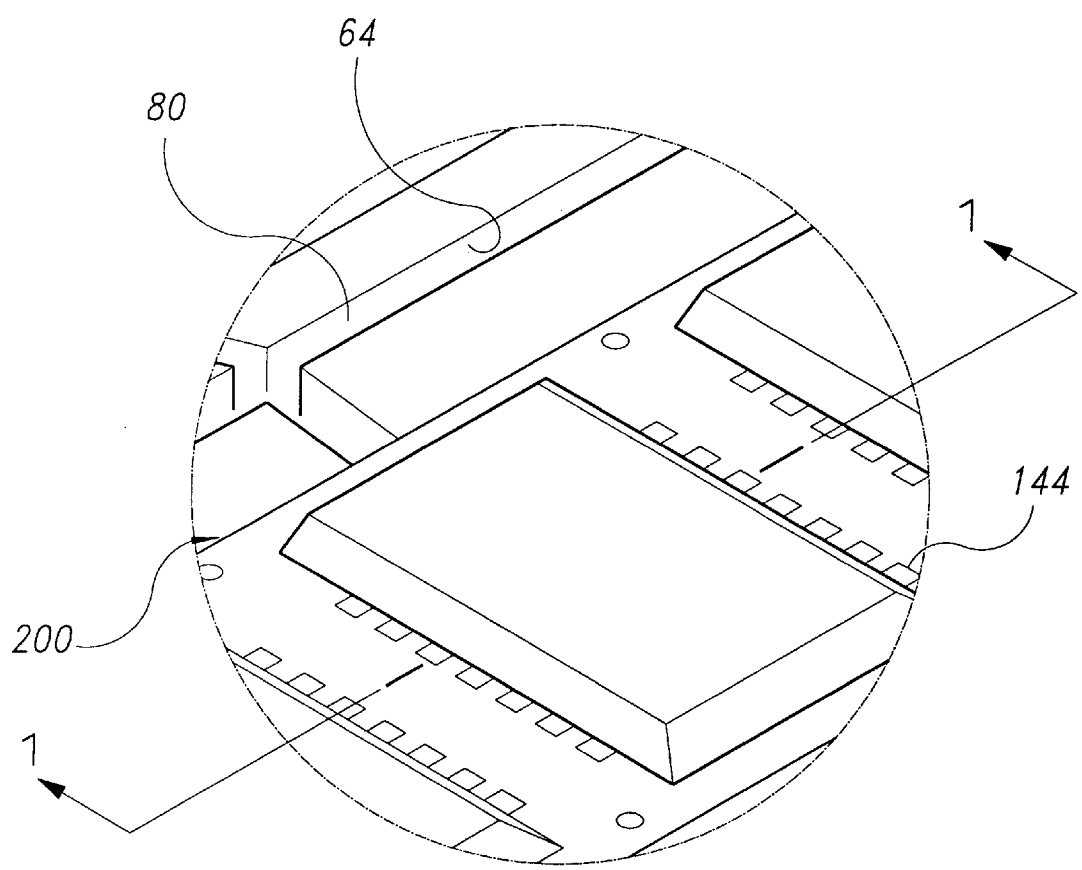
FIG. 6 is an enlarged perspective view of the part 'C' in FIG. 5.
Figure 7:
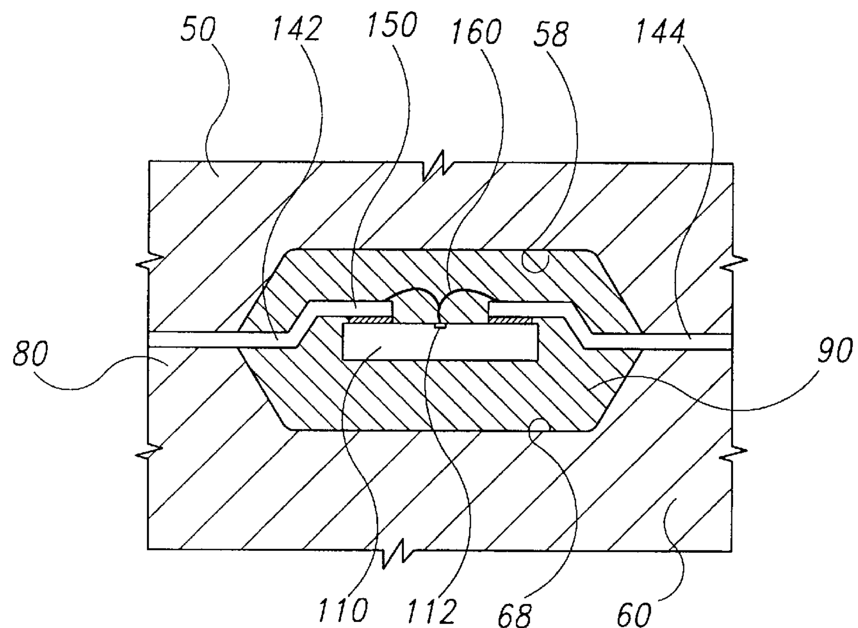
FIG. 7 is a sectional view taken along the line '7—7' in FIG. 6.
Figure 8:
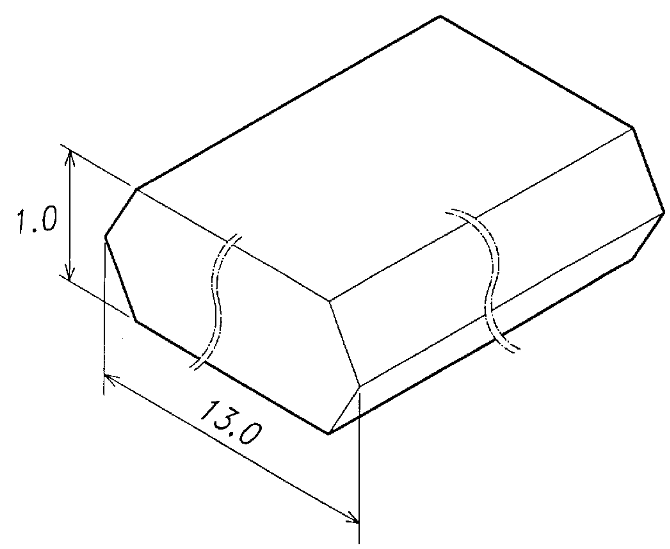
FIG. 8 depicts a schematic model of a transfer mold used to study molding compound velocity and the distribution of air traps within the conventional mold.

The present invention will now be described in more detail with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. In the drawings, the thickness of layers and regions are exaggerated for clarity. Like numbers refer to like elements throughout.

Figure 11:
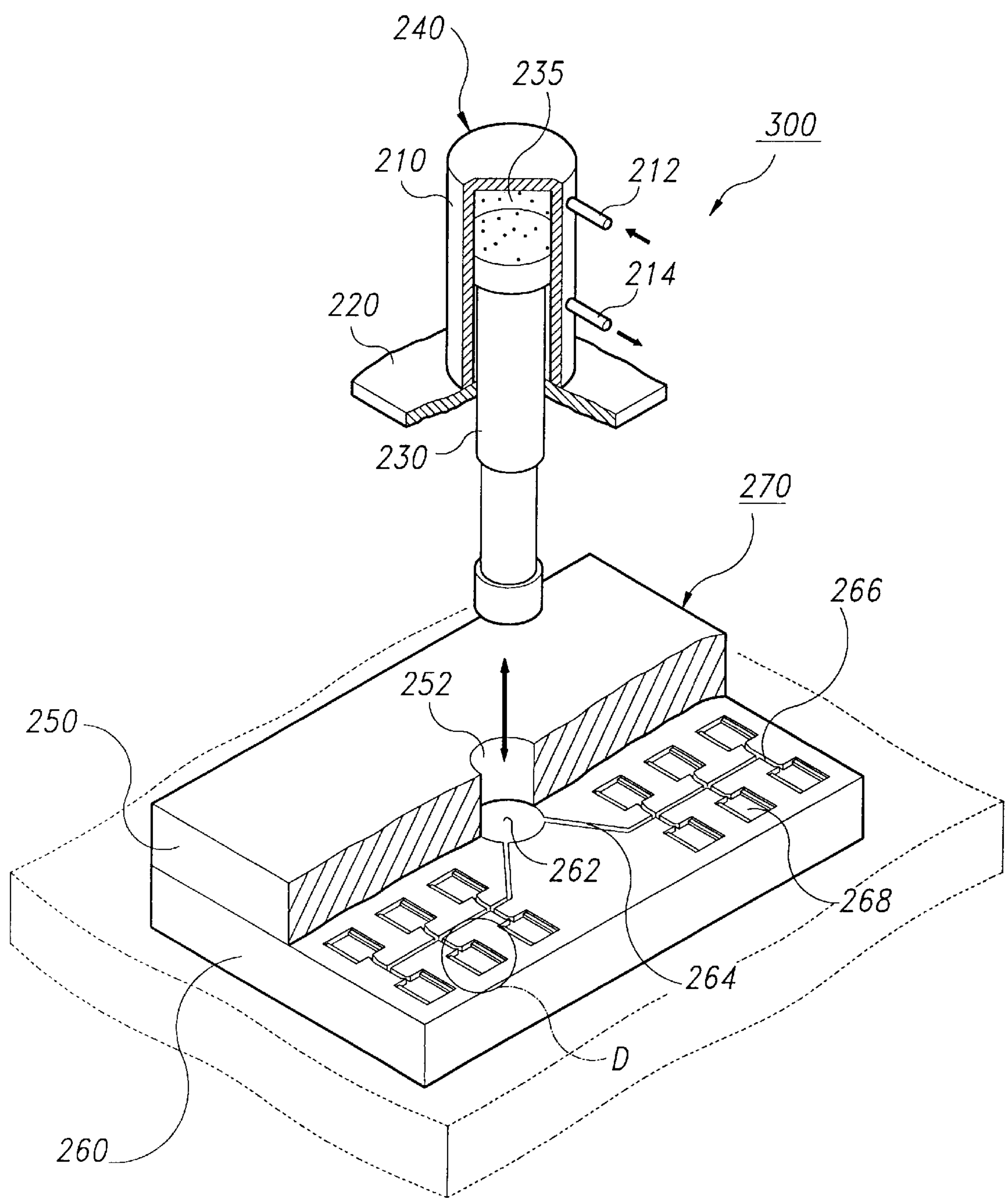
FIG. 11 is an exploded perspective view of a transfer mold for encapsulation of semiconductor device packages according to the present invention.
Figure 12:
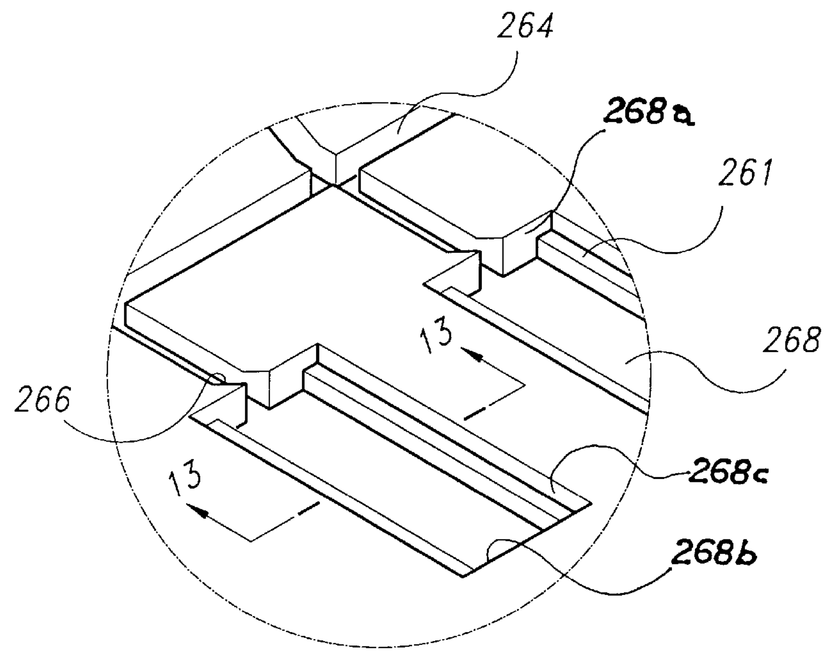
FIG. 12 is an enlarged perspective view of the part 'D' in FIG. 11.
Figure 13:
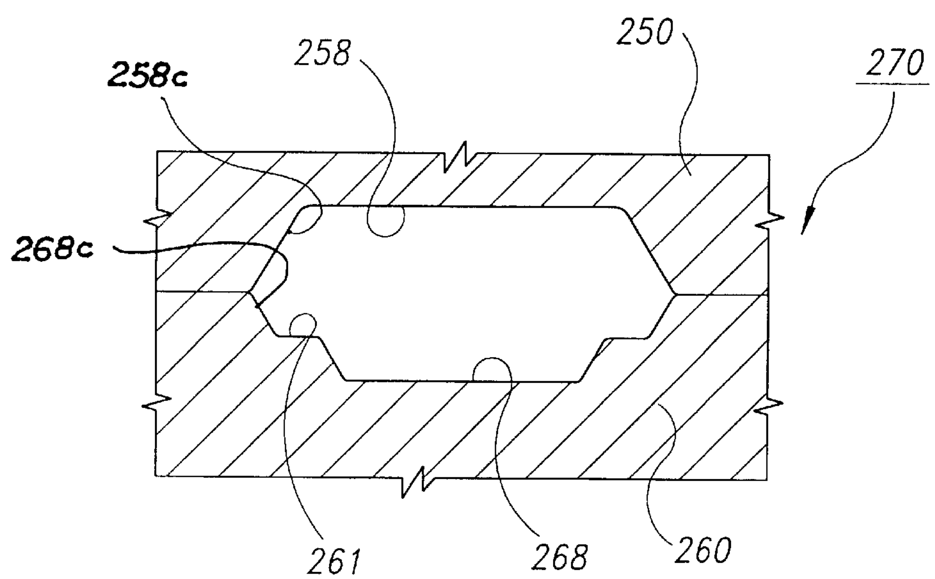
FIG. 13 is a sectional view taken along the line '13—13' in FIG. 12.
Figure 14A:
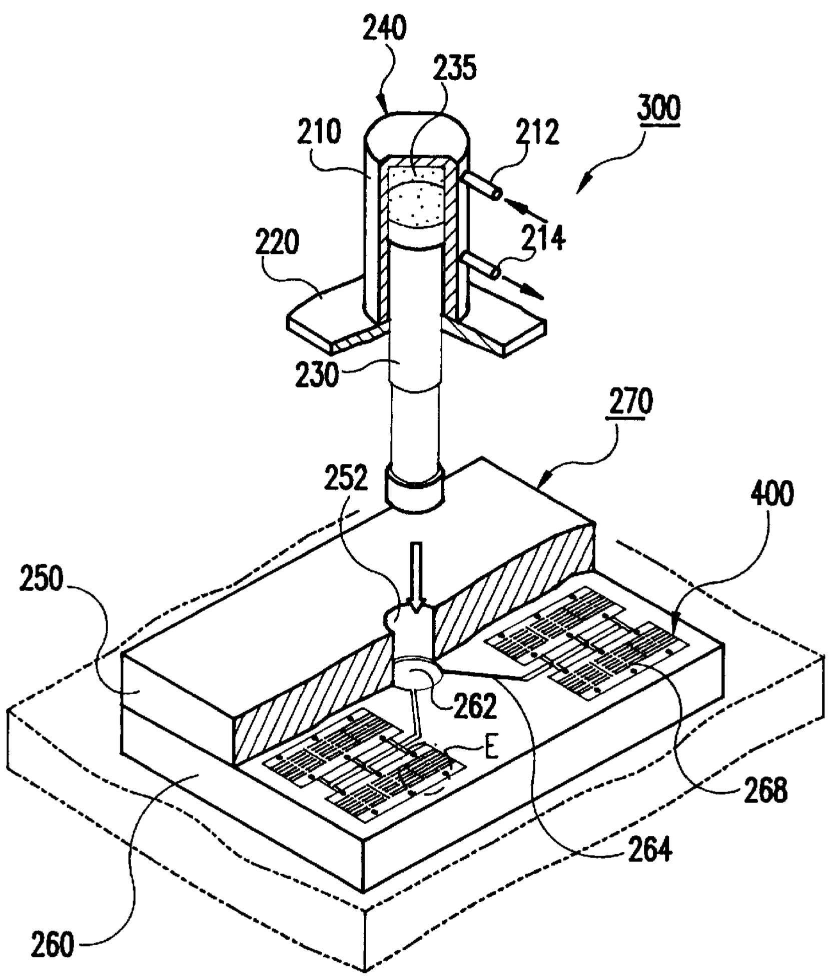
FIG. 14A is a perspective view depicting a lead frame placed within the transfer mold of the present invention.
Figure 14B:
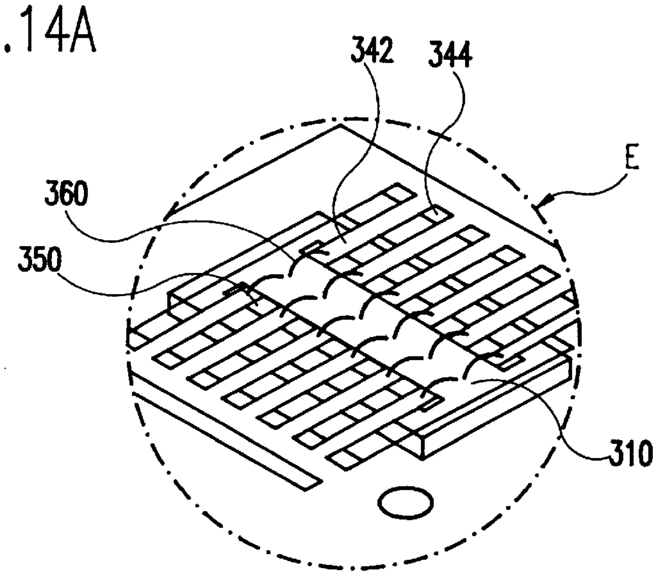
FIG. 14B is an enlarged view of portion 'E' in FIG. 14A.
Figure 15:
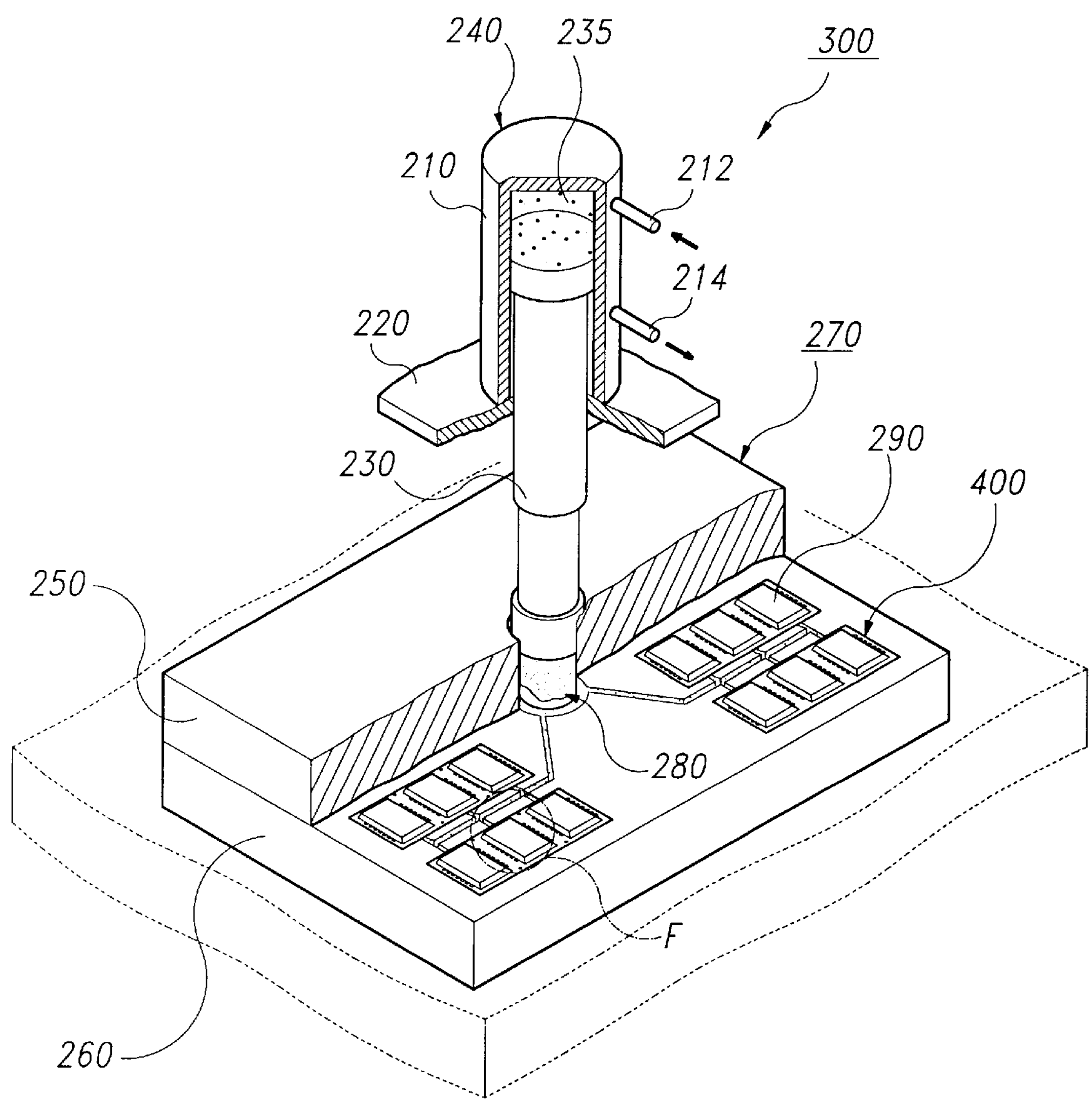
FIG. 15 is a perspective view depicting the package assemblies after molding using the transfer mold of the present invention.
Figure 16:
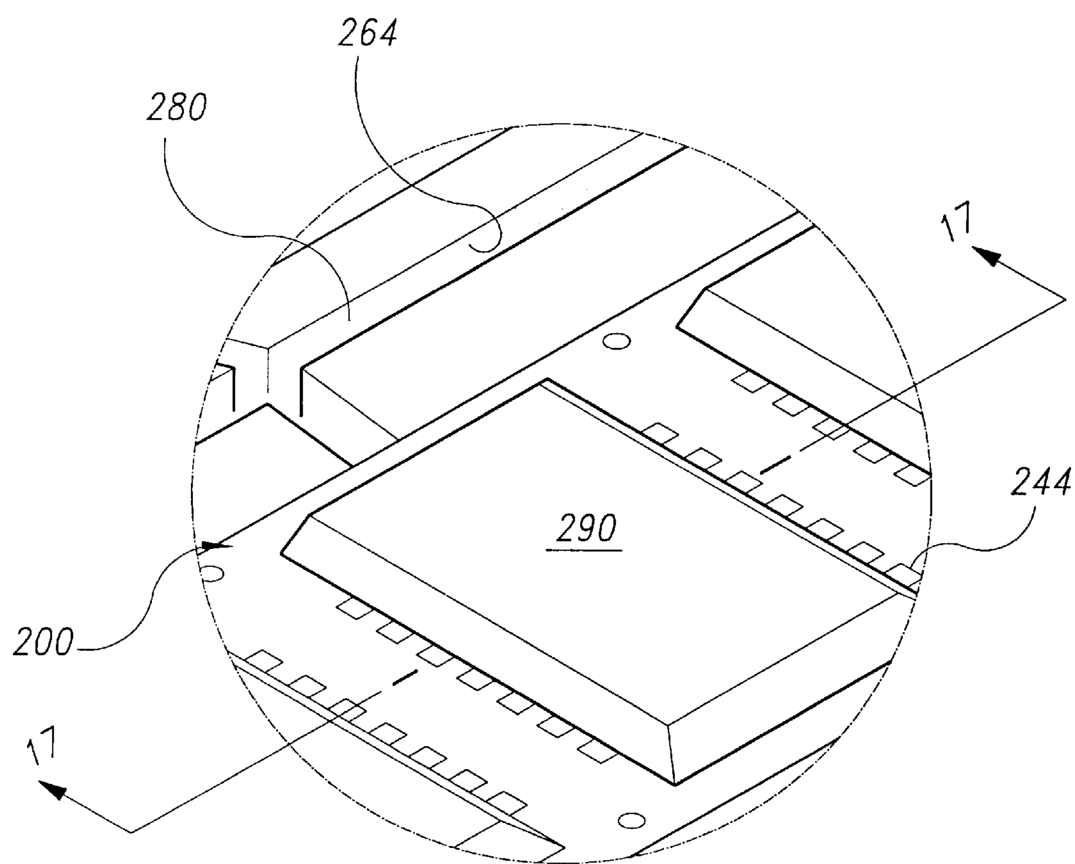
FIG. 16 is an enlarged perspective view of the part 'F' in FIG. 15.
Figure 17:
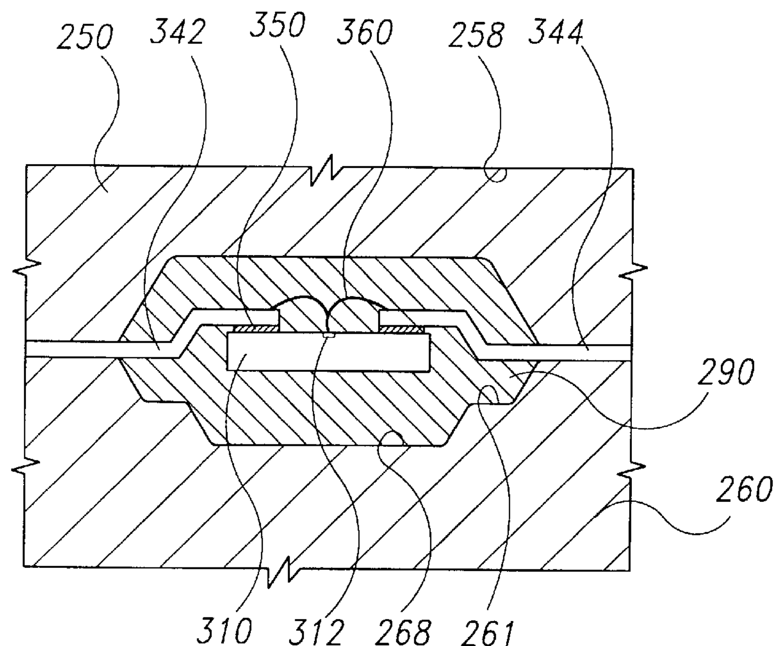
FIG. 17 is a sectional view taken along the line '17—17' in FIG. 16.

FIG. 11 is an exploded perspective view of a transfer mold for encapsulation of semiconductor device packages according to the present invention; FIG. 12 is an enlarged perspective view of the part 'D' in FIG. 11; FIG. 13 is a cross-sectional view taken along the line '13—13' in FIG. 12; FIG. 14A is a perspective view depicting a lead frame placed within the transfer mold and FIG. 14B is an enlarged view of portion 'E' in FIG. 14A; FIG. 15 is a perspective view depicting the package assemblies after the molding process is completed; FIG. 16 is an enlarged perspective view of the part 'F' in FIG. 15; and FIG. 17 is a cross-sectional view taken along the line '17—17' in FIG. 16.

With reference to FIGS. 11 through 17, the mold 300 comprises a mold body 270 having an upper mold die 250 and a lower mold die 260. The lower mold die 260 has continuous inward projections 261 along opposite bottom edges in the direction of flow of the molding compound 280. The molding compound 280 is introduced from the runner 264 into the gate 266 and into the cavity 268. The projections 261 protrude into the interior of the cavity 268 to a specified height. The height of the projections 261 is less than the height of the cavity 268 of the lower mold 260. The upper mold die 250 has a cavity 258 which together with the cavity 268 of the lower mold die 260 forms the mold cavity. As is clear from FIGS. 12 and 13, the mold cavity has a first end defined by a first end wall of the upper mold die 250 and a corresponding first end wall (268*a* in FIG. 12) of the lower mold die 260, a second end defined by a second end wall of the upper mold die 250 and a corresponding second end wall 268*b* of the lower mold die 260, and sides defined by side walls 258*c*, 268*c* of the upper and lower mold dies 250, 260. The side walls 258*c*, 268*c* extend from the first end walls to the second end walls of the upper and lower mold dies 250, 260, respectively. The gate 266 opens into the mold cavity at the first end thereof at a location intermediate the side walls 258*c*, 268*c*. The molding compound is introduced through the gate 266 into the cavity so as to flow toward the second end of the cavity in a direction of flow parallel to the sides of the cavity.

The mold 300 comprises a pressing means 240 having a support plate 220 and a cylinder 210 integral with the support plate 220, the cylinder 210 containing an oil 235, a hydraulic inlet port 212 and a hydraulic outlet port 214, and a press cylinder rod 230.

The upper mold die 250 has a port 252 where molding compound tablets are loaded, and a plurality of cavities 258. The lower mold die 260 has a chase 262 for receiving molding compound tablets. Each runner 264 is in communication with the chase 262.

As shown in FIGS. 14 and 17, lead frame strips 400 are placed into the cavities 268 in the lower mold die 260. The lead frame strips comprise a plurality of lead frame units, each lead frame unit having a chip 310, inner leads 342, outer leads 344, and electrical connection means such as bonding wires 360. The chip 310 is attached to the inner leads 342 with an adhesive 350 such as double-sided polyimide tape. The bonding wires 360 connect inner leads 342 to bonding pads 312 on the chip 310.

The upper mold die 250 is lowered until its bottom surface contacts the upper surface of lower mold die 260. Pressing means 240 is lowered until the bottom of the press cylinder rod 230 contacts the molding compound tablets which are loaded through port 252 in the upper mold die into chase 262 in the lower mold die, or until the press cylinder rod 230 reaches a specified distance from the tablets. The tablets have been melted either by a separate heater or by preheating the upper and lower mold dies. The fluid molding compound 280 flows into the mold cavities 258, 268 through runners 264 and gates 266; and encapsulated lead frame units 290 are formed. The lead frame strip 400 is then removed from the mold die.

Figure 18:
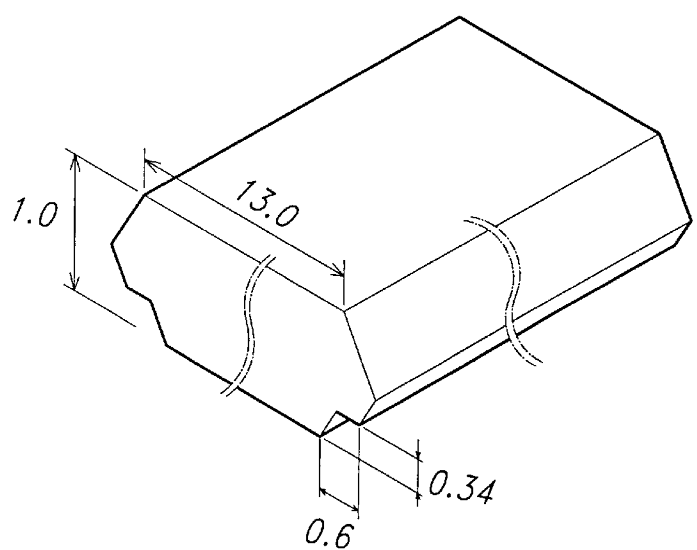
FIG. 18 depicts a schematic model of the mold of the present invention used to study molding compound velocity and the distribution of air traps within the transfer mold of the present invention.
Figure 19:
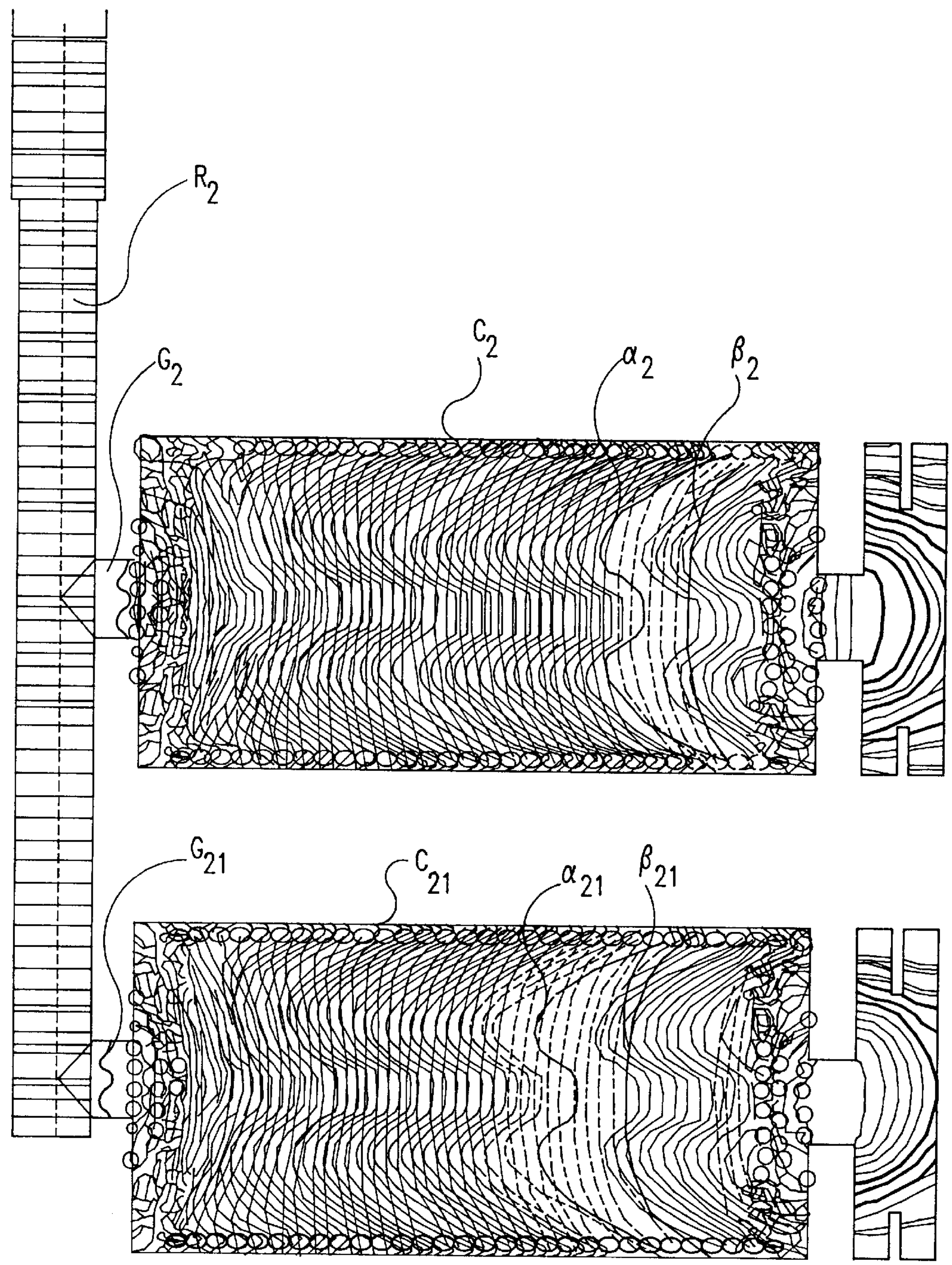
FIG. 19 depicts a result of simulations for determining the molding compound flow within the transfer mold of the present invention.
Figure 20:
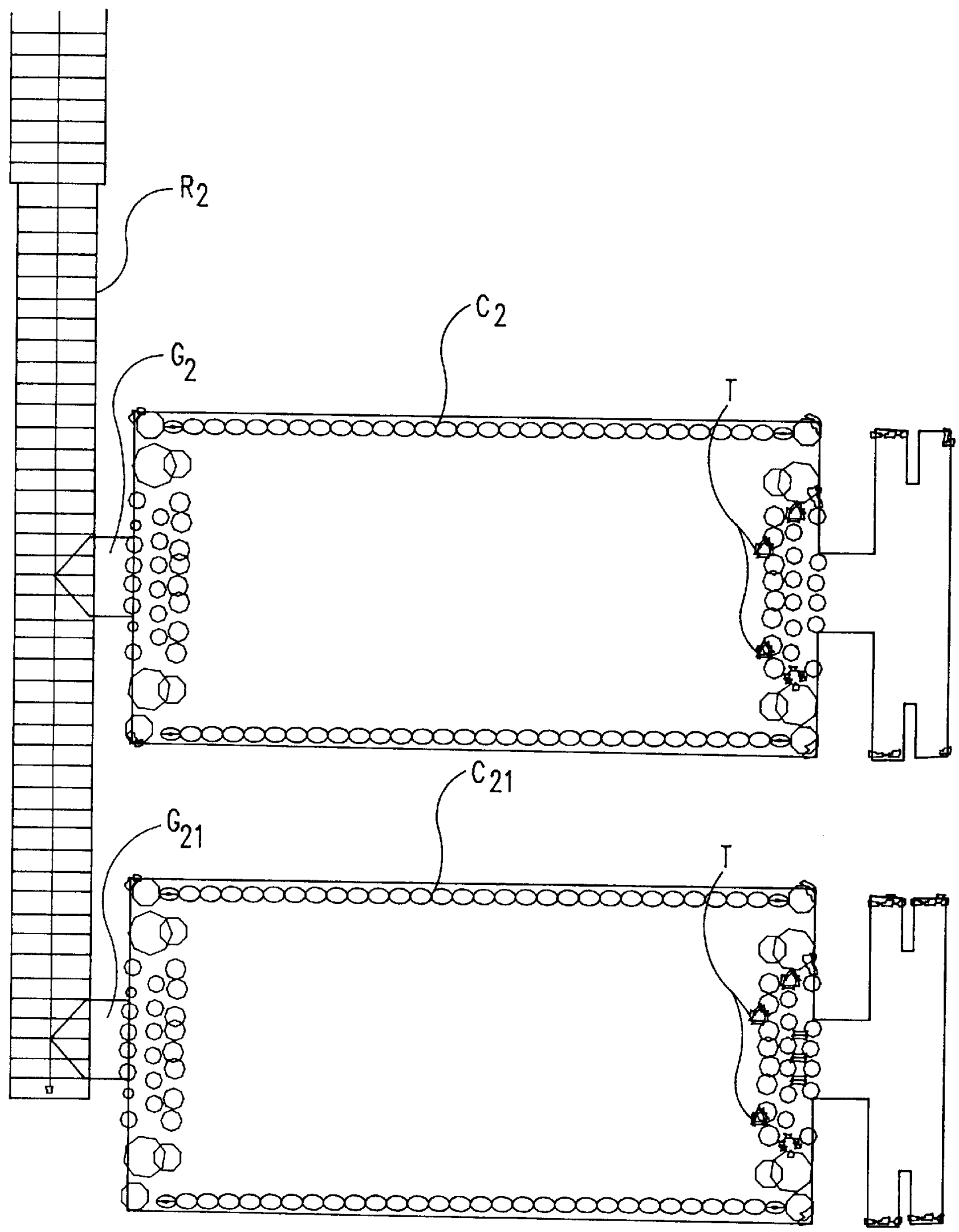
FIG. 20 depicts the distribution of air traps in the upper and lower mold die of the cavity, which is obtained from the result in FIG. 19.

FIG. 18 depicts a schematic diagram of a model used to study molding compound velocity and the distribution of air traps within the transfer mold; FIG. 19 depicts the result of simulations for determining the molding compound flow within the transfer mold die; and FIG. 20 depicts the distribution of air traps in the upper and lower mold die, which is obtained from the result in FIG. 19. Note that in FIG. 20, similarly to FIG. 10, the small and large circles simulate the small and large openings of a lead frame during the simulation of the flow of molding compound within the transfer mold.

With reference to FIGS. 18 through 20, the model having a cavity employed for the simulations has a size of 1.0 mm×13.00 mm and two projections within the cavity have a size of 0.6 mm×0.34 mm. All the components within the cavity are omitted for simplicity. The molding compound runs through a common runner $R_2$, and flows into the cavity $C_2$ via the gate $G_2$ and then flows into the next cavity $C_{21}$ via the gate $G_{21}$.

The shear velocities $\beta_2$ and $\beta_{21}$ in the lower mold die are greater than the shear velocities $\alpha_2$ and $\alpha_{21}$ in the upper mold die, since the flow channel in the upper mold die is narrower than that in the lower mold die, and the molding compound flowing therein undergoes a greater flow resistance. Further, since the molding compound is introduced into the lower mold die after being introduced into the upper mold cavity and the shear velocities $\alpha_2$ and $\alpha_{21}$, and $\beta_2$ and $\beta_{21}$ are measured at the same time, respectively, the shear velocities $\beta_2$ and $\beta_{21}$ in the lower mold cavity are inevitably higher than $\alpha_2$ and $\alpha_{21}$ in the upper mold cavity.

The air traps T produced within the encapsulated package are localized at the positions having the greatest deviation of the shear velocities shown in FIG. 19. Moreover, more air traps T are observed at the positions farthest from the gates $G_2$, $G_{21}$ of the cavities $C_2$, $C_{21}$ than other areas.

Figure 9:
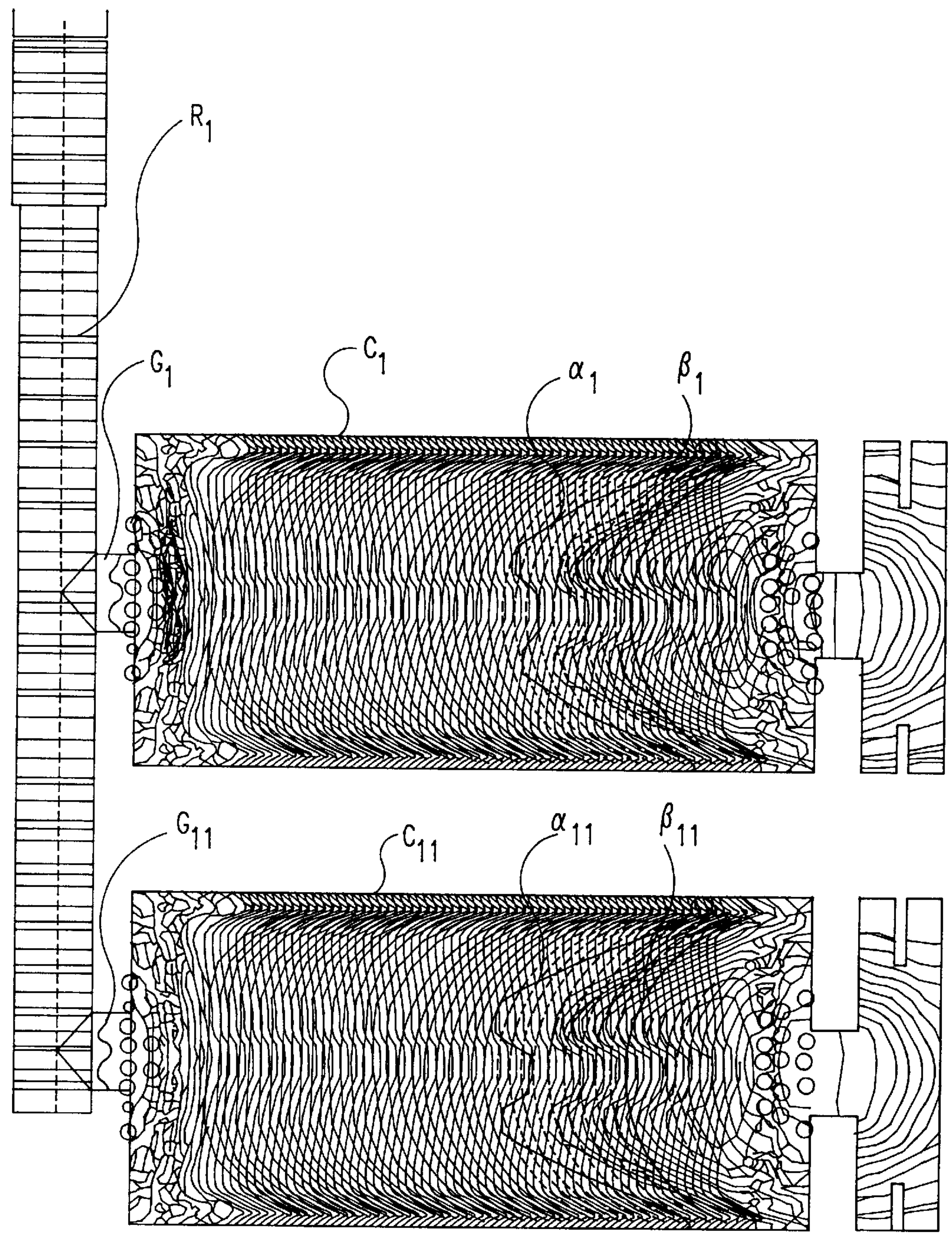
FIG. 9 depicts a result of simulations for determining the molding compound flow within the conventional transfer mold.

The deviations between the shear velocities $\alpha_2$ and $\beta_2$, and $\alpha_{21}$ and $\beta_{21}$ in FIG. 19 are far less than the deviations between the $\alpha_1$ and $\beta_1$, and $\alpha_{11}$ and $\beta_{11}$ shown in FIG. 9.

Figure 10:
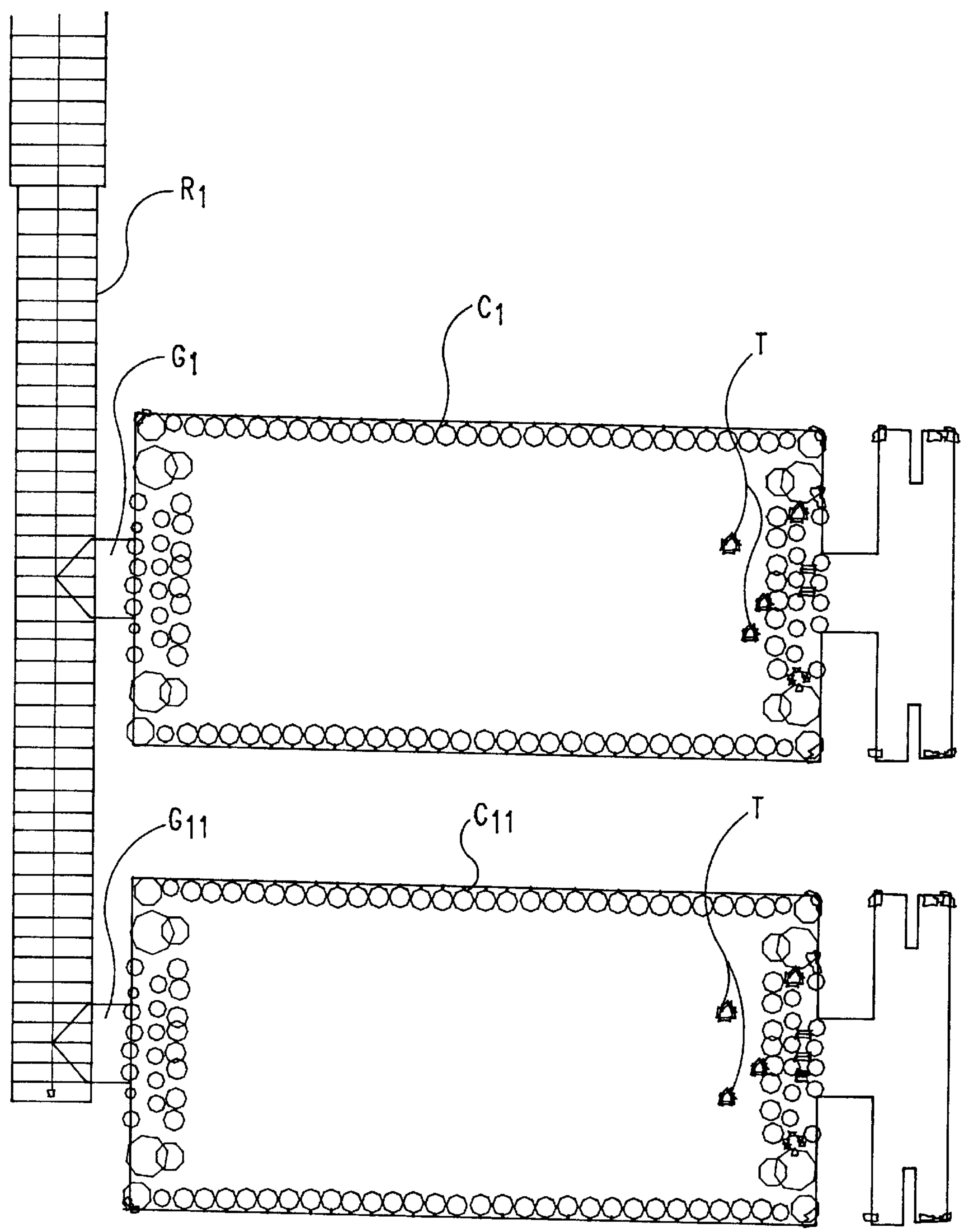
FIG. 10 depicts the distribution of air traps in the upper and lower mold die of the cavity, which is obtained from the result in FIG. 9.

The results in FIG. 20 regarding the distribution of air traps T are compared with those in FIG. 10 as follows. In the conventional mold, each of cavities $C_1$ and $C_{11}$ contain two air traps T formed at the position where the lead frame is located and many other air traps T that are localized at or near the edge opposing the gate G. However, in the mold of the present invention for cavities $C_2$ and $C_{21}$, all the air traps T are localized at or near the edge opposing the gate G.

As can be seen from the shear velocity curves in FIG. 9, the shear velocity at the edges of the cavity is far greater than that at the center, which is responsible for the formation of air traps at the positions where the lead frame is located. The shear velocity is proportional to the cross-sectional area. According to the present invention, the difference between the shear velocities at the edges and at the center can be reduced by providing continuous projections along the edges of the cavity in the direction of flow of the molding compound.

The degree of reduction of the shear velocity due to the projections becomes greater when the mold die has a larger number of cavities, since a greater force is required to introduce a larger amount of the molding compounds to the larger number of cavities, resulting in a greater difference of shear velocities between the center and the edges in the cavities.

Figure 21A:
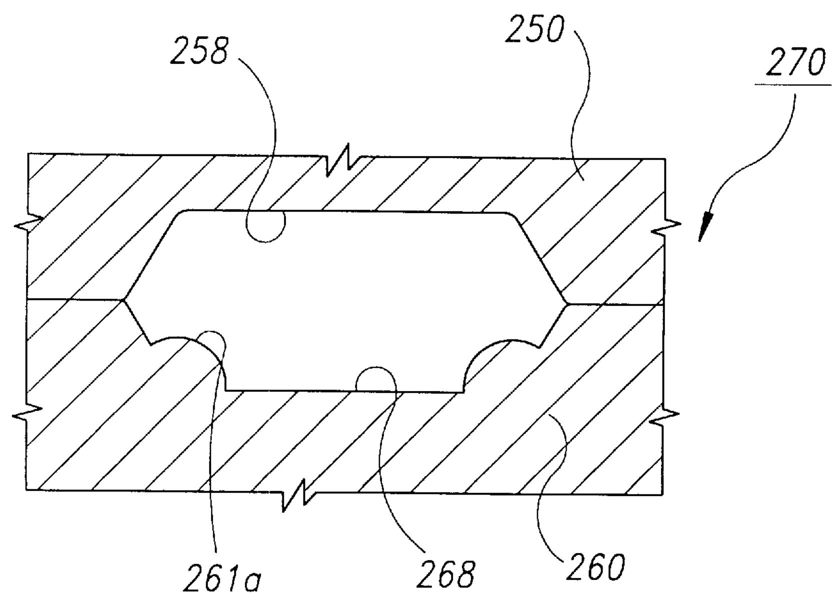
FIGS. 21A, 21B and 21C depict various projection shapes of the present invention in cross-section.
Figure 21B:
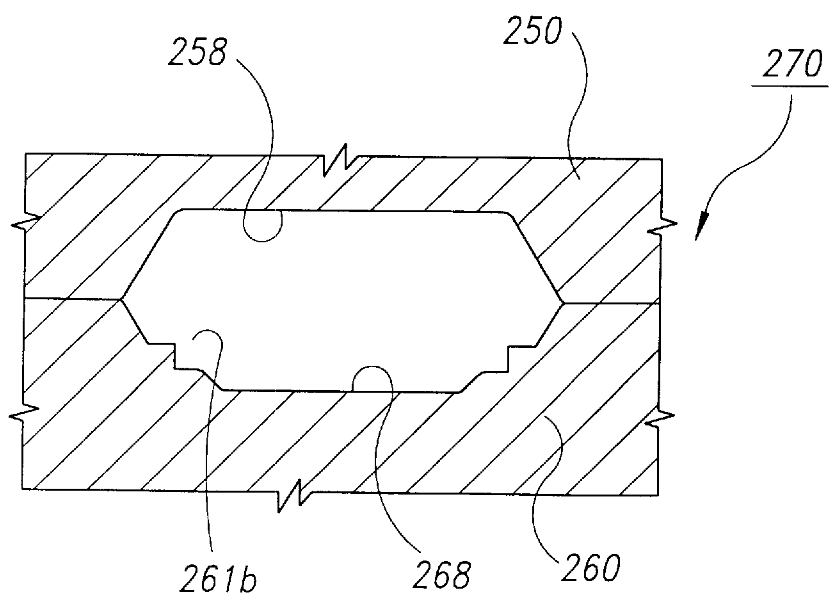
Figure 21C:
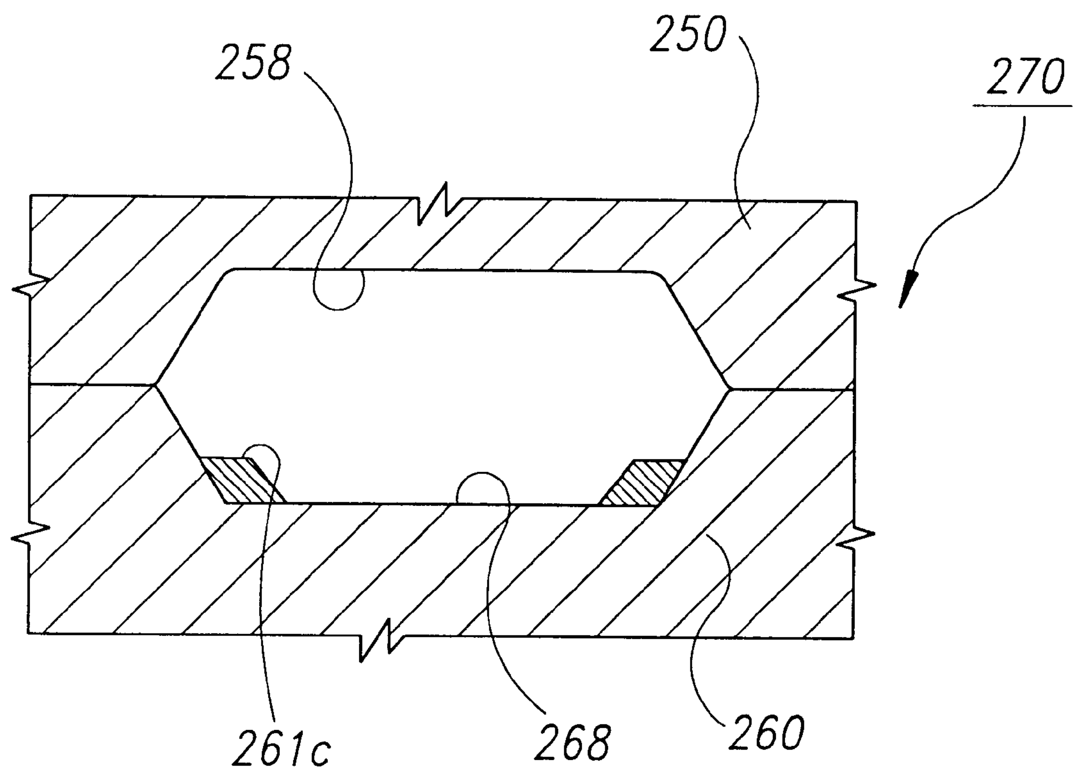

Although the projection depicted in FIG. 12 has a long rectangular shape, the shape is not limited thereto and can be changed or modified, for example, to a long cylindrical column 261*a* as in the cross-section of FIG. 21A. The projections may have at least one step 261*b* as in FIG. 21B. Further, the shape and size of the cavity also can be changed or modified in order to be adapted for the encapsulation of chip-on-lead (COL) packages, which are also considered within the scope of the present invention. For example, the projections may be formed integrally with the lower mold die as in FIG. 13, or as separate block bodies 261*c* as in FIG. 21C.

The present invention also is advantageous in that it can easily be adapted for the production of a variety of packages in different shapes in a small amount of time by using separate projection blocks depending on the shape of the package to be encapsulated.

The present invention is further advantageous in that the amount of molding compound used in the encapsulation is reduced by the same amount as the volume of the projections.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A mold for encapsulating a semiconductor device package in an encapsulant molding compound, said mold comprising: a mold body consisting of an upper mold die and a lower mold die, said upper mold die and lower mold die together forming a cavity where the package is encapsulated by the molding compound, said cavity having a first end defined by first end walls of said upper and lower mold dies a second end defined by second end walls of said upper and lower mold dies, and sides defined by side walls of said upper and lower dies and which side walls extend from said first end walls to said second end walls, respectively said mold also having a gate opening into said cavity at said first end thereof at a location spaced from said side walls such that the molding compound will flow toward said second end of the cavity in a flow direction parallel to said side walls, and said lower mold die having a pair of projections projecting into said cavity from the sides thereof, respectively, each of said projections extending longitudinally from the first end wall of said lower mold die to said second end wall thereof in said direction of flow of the molding compound, and said projections being symmetrical with respect to said direction of flow of the molding compound.

2. The mold according to claim 1, wherein said projections have rectangular surfaces confronting said cavity.

3. The mold according to claim 2, wherein said projections each form at least one step in the respective side wall of the lower mold die.

4. The mold according to claim 1, wherein said projections have a height less than a height of that portion of said cavity defined by the lower mold die.

5. The mold according to claim 1, wherein said projections each have the shape of a portion of a cylindrical column.

6. The mold according to claim 1, wherein said projections are unitary portions of said lower mold die.

7. The mold according to claim 1, wherein said projections are bodies separate from said lower mold die and are joined thereto.

* * * * *